(12) United States Patent
Park et al.

(10) Patent No.: US 11,205,362 B2
(45) Date of Patent: Dec. 21, 2021

(54) DISPLAY DRIVING CIRCUIT COMPRISING PROTECTION CIRCUIT

(71) Applicant: Samsung Electronics Co., Ltd., Suwon-si (KR)

(72) Inventors: Hyunjun Park, Suwon-si (KR); Hongkook Lee, Suwon-si (KR); Donghwy Kim, Suwon-si (KR); Dongkyoon Han, Suwon-si (KR); Jongkon Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/970,229

(22) PCT Filed: Feb. 22, 2019

(86) PCT No.: PCT/KR2019/002181
§ 371 (c)(1),
(2) Date: Aug. 14, 2020

(87) PCT Pub. No.: WO2019/164322
PCT Pub. Date: Aug. 29, 2019

(65) Prior Publication Data
US 2021/0118348 A1  Apr. 22, 2021

(30) Foreign Application Priority Data

Feb. 23, 2018  (KR) ........................ 10-2018-0022139

(51) Int. Cl.
*G09G 3/20* (2006.01)
(52) U.S. Cl.
CPC ....... *G09G 3/20* (2013.01); *G09G 2300/0452* (2013.01); *G09G 2310/0267* (2013.01);
(Continued)

(58) Field of Classification Search
CPC ......... G09G 2310/0291; G09G 3/3696; G09G 2300/0408; G09G 2330/04
See application file for complete search history.

(56) References Cited

U.S. PATENT DOCUMENTS

| 7,110,229 B2 | 9/2006 | Yang et al. |
| 7,522,441 B2 | 4/2009 | Kumagai et al. |

(Continued)

FOREIGN PATENT DOCUMENTS

| EP | 3 029 729 A2 | 6/2016 |
| JP | 2011-124379 A | 6/2011 |

(Continued)

OTHER PUBLICATIONS

Partial Supplementary European Search Report dated Mar. 9, 2021, issued in European Application No. 19757297.7.
(Continued)

*Primary Examiner* — Gerald Johnson
(74) *Attorney, Agent, or Firm* — Jefferson IP Law, LLP

(57) ABSTRACT

There is disclosed an electronic device including a display panel including one or more pixels, one or more gate drivers receiving electric power from a first power supply, and a display driver integrated circuit configured to drive the display panel. Any one of the one or more gate drivers is connected to a first pixel of the one or more pixels, the display driver integrated circuit includes one or more source drivers including a first source driver and at least one protection circuit connected to the first source driver, the first source driver includes one or more amplifier circuits receiving electric power from a second power supply different from the first power supply and connected to the first pixel, the at least one protection circuit is connected to a power input terminal of the one or more amplifier circuits, and at least a portion of the at least one protection circuit is branched between the second power supply and the power (Continued)

input terminal to be connected to a ground of the display driver integrated circuit. In addition to the above, various embodiments identified through the specification are possible.

14 Claims, 12 Drawing Sheets

(52) U.S. Cl.
CPC .............. *G09G 2310/0272* (2013.01); *G09G 2310/0291* (2013.01); *G09G 2320/0673* (2013.01); *G09G 2330/021* (2013.01); *G09G 2330/04* (2013.01)

(56) References Cited

U.S. PATENT DOCUMENTS

| | | | |
|---|---|---|---|
| 8,547,773 | B2 | 10/2013 | Saiki et al. |
| 8,638,276 | B2 | 1/2014 | Lee et al. |
| 9,530,348 | B2 | 12/2016 | Lee |
| 9,589,950 | B2 | 3/2017 | Kim et al. |
| 9,735,053 | B2 | 8/2017 | Cho et al. |
| 10,013,948 | B2 | 7/2018 | Lee et al. |
| 10,354,582 | B2 | 7/2019 | Kim |
| 10,510,325 | B2 | 12/2019 | Jin et al. |
| 2006/0119998 | A1 | 6/2006 | Yang et al. |
| 2007/0002061 | A1 | 1/2007 | Kumagai et al. |
| 2007/0013634 | A1* | 1/2007 | Saiki .................... G09G 3/3674 345/98 |
| 2010/0007674 | A1 | 1/2010 | Lee et al. |
| 2011/0193844 | A1* | 8/2011 | Lee ....................... G09G 3/3696 345/211 |
| 2011/0273494 | A1 | 11/2011 | Jun |
| 2015/0015464 | A1 | 1/2015 | Lee |
| 2016/0125781 | A1 | 5/2016 | Yang |
| 2016/0125851 | A1 | 5/2016 | Jin et al. |
| 2016/0155408 | A1 | 6/2016 | Lee et al. |
| 2017/0076665 | A1 | 3/2017 | Kim |

FOREIGN PATENT DOCUMENTS

| | | |
|---|---|---|
| KR | 10-0805499 B1 | 2/2008 |
| KR | 10-2011-0024152 A | 3/2011 |
| KR | 10-2014-0120763 A | 10/2014 |
| KR | 10-2015-0040667 A | 4/2015 |
| KR | 10-2016-0062308 A | 6/2016 |
| KR | 10-2017-0141323 A | 12/2017 |

OTHER PUBLICATIONS

European Search Report dated Jun. 17, 2021, issued in European Application No. 19757297.7.

* cited by examiner

DISPLAY DRIVING CIRCUIT COMPRISING PROTECTION CIRCUIT

TECHNICAL FIELD

Embodiments disclosed in the present disclosure relate to a technique for protecting a source driver by preventing a change in an input voltage due to a sudden change in power in a display having a high resolution.

BACKGROUND ART

With the development of mobile communication technology, electronic devices including a display, such as a smartphone and a wearable device, have been widely used. Users are able to perform various functions through a screen output on the display, such as photographing still images or moving images, playing music files or video files, playing games, or surfing the Internet.

DISCLOSURE OF THE INVENTION

Technical Problem

If external charges are introduced into the display of the electronic device by touch of the user or external stimulation, an electro-static discharging (ESD) occurs. If the electro-static discharging occurs, external charges are introduced into a display driver integrated circuit.

The electric charges, which have been introduced into the display driver integrated circuit due to the electro-static discharging, are introduced into a power supply of a data driver. When the electric charges are introduced into the power supply, the magnitude of the voltage of the power supply is made larger than that of the power supply voltage in normal circumstances. If the magnitude of the voltage of the power supply is increased, it is likely that amplifiers in the data driver, which receive power supply voltage from the power supply, are damaged.

Embodiments disclosed in the present disclosure are to provide an electronic device for solving the aforementioned problems and the problems posed in the present disclosure.

Technical Solution

An electronic device according to an embodiment disclosed in the present disclosure includes a display panel including one or more pixels, one or more gate drivers receiving electric power from a first power supply, and a display driver integrated circuit configured to drive the display panel. Any one of the one or more gate drivers is connected to a first pixel of the one or more pixels, the display driver integrated circuit includes one or more source drivers including a first source driver and at least one protection circuit connected to the first source driver, the first source driver includes one or more amplifier circuits receiving electric power from a second power supply different from the first power supply and connected to the first pixel, the at least one protection circuit is connected to a power input terminal of the one or more amplifier circuits, and at least a portion of the at least one protection circuit is branched between the second power supply and the power input terminal to be connected to a ground of the display driver integrated circuit.

A display driver integrated circuit according to an embodiment disclosed in the present disclosure includes one or more source drivers, a gamma block connected to a first source driver of the one or more source drivers, and at least one protection circuit connected to the first source driver. The first source driver includes one or more amplifier circuits receiving electric power from a second power supply different from a first power supply supplying electric power to one or more gate drivers, and outputting a data voltage, and one or more decoders connected to the one or more amplifier circuits, the at least one protection circuit is connected to a power input terminal of the one or more amplifier circuits, at least a portion of the at least one protection circuit is branched between the second power supply and the power input terminal to be connected to a ground of the display driver integrated circuit, and the at least one protection circuit includes a filter element having a first terminal connected to the second power supply and the at least one or more amplifier circuits, a resistor disposed between a second terminal of the filter element and the ground, and a switching element including a control terminal connected to a second terminal of the filter element, a first terminal connected to the first terminal of the filter element, and a second terminal connected to the ground.

Furthermore, an electronic device according to an embodiment disclosed in the present disclosure includes a display panel including one or more pixels, one or more gate drivers receiving electric power from a first power supply, and a display driver integrated circuit configured to drive the display panel. Any one of the one or more gate drivers is connected to a first pixel of the one or more pixels, the display driver integrated circuit includes one or more source drivers including a first source driver, a gamma block connected to the first source driver, a first protection circuit connected to the first source driver, and a second protection circuit connected to the gamma block, the first source driver includes one or more amplifier circuits receiving electric power from a second power supply different from the first power supply and connected to the first pixel, the first protection circuit is branched between the second power supply a first input terminal of the one or more amplifier circuits to be connected to a ground of the display driver integrated circuit, the gamma block includes one or more gamma string circuits receiving a gamma reference voltage from one or more gamma adjustment circuits and outputting a gamma voltage, and the second protection circuit is branched between the second power supply and a second power input terminal of the one or more gamma string circuits to be connected to the ground.

Advantageous Effects

According to the embodiments disclosed in the present disclosure, if external charges are introduced into the display of the electronic device due to electro-static discharging, the introduced electric charges are discharged to the ground through the protection circuit before the electric charge is introduced from the power supply to the amplifiers inside the source driver. If the protection circuit discharges the introduced electric charges, even if electro-static discharging occurs, the introduced electric charges are not transferred to the amplifier, which makes it possible to prevent the amplifier from being damaged. Accordingly, it is possible to prevent the source driver from outputting an abnormal data voltage due to damage to the amplifier caused by electro-static discharging.

Besides, various effects may be provided that are directly or indirectly identified through the present disclosure.

BRIEF DESCRIPTION OF THE DRAWINGS

With respect to the description of the drawings, the same or similar reference signs may be used for the same or similar elements.

MODE FOR CARRYING OUT THE INVENTION

Hereinafter, various embodiments disclosed in the present disclosure will be described with reference to the accompanying drawings. However, this is not intended to limit the present disclosure to the specific embodiments, and it is to be construed to include various modifications, equivalents, and/or alternatives of embodiments of the present disclosure.

Figure 1:
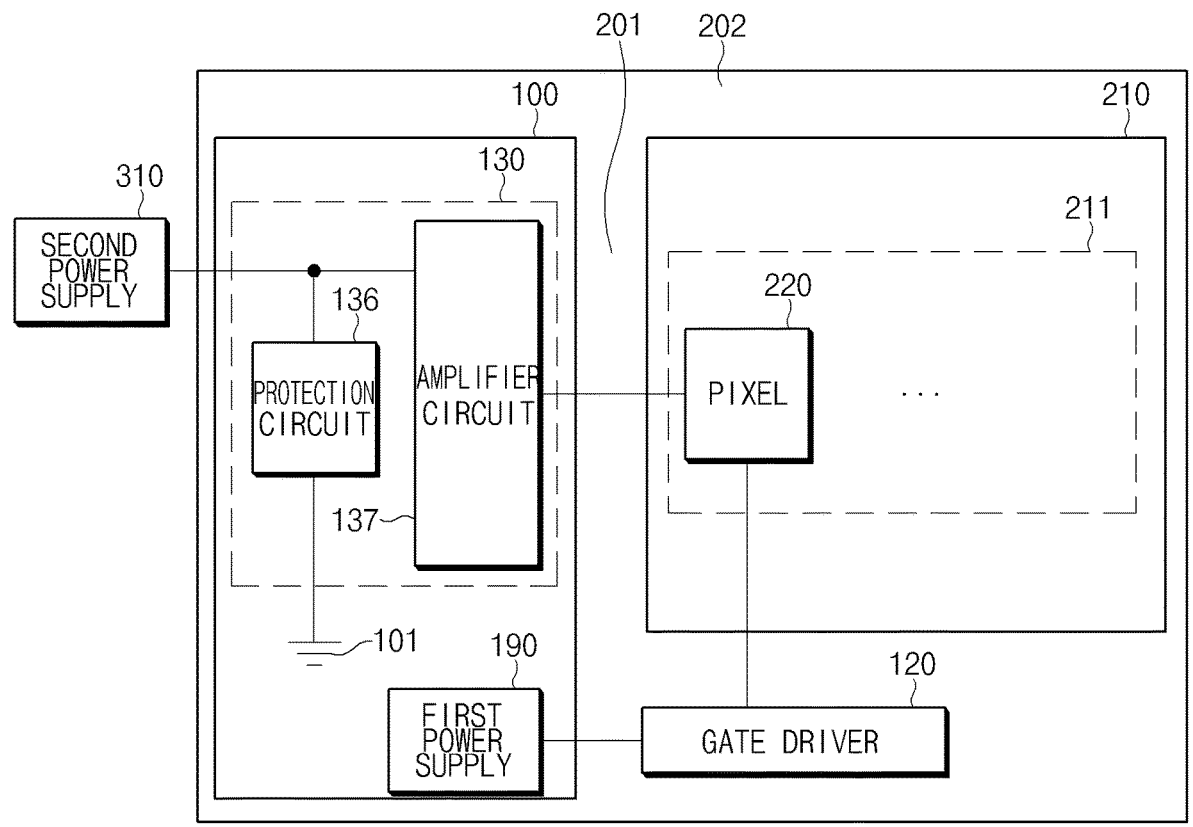
FIG. 1 is a schematic block diagram illustrating a display driver integrated circuit and a display panel according to an embodiment.

FIG. 1 is a schematic block diagram illustrating a display driver integrated circuit (DDI) 100 and a display panel 200 according to an embodiment. The display driver integrated circuit 100 and the display panel 200 illustrated in FIG. 1 may be included in an electronic device 1101 illustrated in FIG. 11.

According to an embodiment, the display panel 200 may have an active area 210 displaying an image in the center. The active area 210 may include a plurality of pixels 220. The plurality of pixels 220 may be turned on by a gate voltage to emit light with a predetermined brightness corresponding to the magnitude of the data voltage.

According to an embodiment, the display panel 200 may have a first edge 201 and a second edge 202 on areas other than the active area 210. The first edge 201 may be defined as a border area adjacent to a short side of the display panel 200. The second edge 202 may be defined as a border area adjacent to a long side of the display panel 200.

According to an embodiment, the display driver integrated circuit 100 may be disposed on the first edge 201 of the display panel 200. The display driver integrated circuit 100 may be electrically connected to the display panel 200 at the first edge 201.

According to an embodiment, the display driver integrated circuit 100 may be electrically connected with lines disposed on the display panel 200. For example, the display driver integrated circuit 100 may be connected to gate lines and data lines disposed to cross each other on the active area 210 of the display panel 200. The display driver integrated circuit 100 may transmit various signals via the gate lines and the data lines, and may cause pixels 220 connected to the gate lines and the data lines to emit light.

According to an embodiment, the display driver integrated circuit 100 may include a gate driver 120 and a plurality of source drivers 130.

According to an embodiment, the gate driver 120 may be disposed on the second edge 202. The gate driver 120 may be electrically connected to the display panel 200 at the second edge 202. The gate driver 120 may be driven by receiving electric power from the first power supply 190. The gate driver 120 may apply a gate voltage to the gate lines based on a gate control signal. Transistors included in the pixels 220 may be turned on by the gate voltage. In the present disclosure, the gate driver 120 may be referred to as a scan driver.

The plurality of source drivers 130 may convert image data into a data voltage. The data voltage may mean a voltage capable of charging capacitive elements (e.g., capacitors) included in the pixels 220. The plurality of source drivers 130 may supply the data voltage to the pixels 220. If capacitive elements included in the pixels 220 are charged and currents flow in the light emitting elements by the charged voltage, the pixels 220 may emit light.

According to an embodiment, the plurality of pixels 220 may be classified into a plurality of pixel groups for the first edge 201. Each of the plurality of pixel groups may receive a data voltage from each of the plurality of source drivers 130. The plurality of source drivers 130 may respectively correspond to the plurality of pixel groups. For example, the first source driver 130 may correspond to a first pixel group 211 and supply a data voltage to the pixels 220 included in the first pixel group 211.

According to an embodiment, the first source driver 130 may include one or more amplifier circuits 137. The one or more amplifier circuits 137 may receive electric power from the second power supply 310. The second power supply 310 may be disposed outside the display driver integrated circuit 100. The one or more amplifier circuits 137 may be connected to the first pixel 220 included in the first pixel group 211. The one or more amplifier circuits 137 may be driven by the electric power received from the second power supply 310. The one or more amplifier circuits 137 may change the magnitude of the data voltage by a set gain. The one or more amplifier circuits 137 may output the data voltage to the first pixel.

According to an embodiment, the display driver integrated circuit 100 may include the at least one protection circuit 136 connected to a power input terminal PIN of the one or more amplifier circuits 137. The at least one protection circuit 136 may be branched between the second power supply 310 and the power input terminal PIN. The at least one protection circuit 136 may be connected to a ground 101 of the display driver integrated circuit 100. As illustrated in FIG. 1, the at least one protection circuit 136 may be included inside the first source driver 130. Alternatively, the at least one protection circuit 136 may be implemented as a separate chip outside the first source driver 130.

The at least one protection circuit 136 may transfer a first voltage to the power input terminal PIN of the amplifier 137 when the first voltage supplied from the second power supply 310 is within a normal range. The power input terminal PIN of the amplifier 137 may be a terminal to which a bias power of the amplifier 137 is input. The second power supply 310 may generate the first voltage, which is required for the operation of the amplifier 137. The at least one protection circuit 136 may block the amount of change in the first voltage when the first voltage is out of the normal range. Accordingly, the at least one protection circuit 136 may keep constant the magnitude of the first voltage transferred to the power input terminal PIN of the amplifier 137.

For example, when electric charges are introduced from the second power supply 310 by electro-static discharging (ESD), the at least one protection circuit 136 may discharge the introduced electric charges to the ground 101. When the magnitude of the power supply voltage supplied from the second power supply 310 is rapidly changed by the static electricity, the at least one protection circuit 136 may discharge, to the ground 101 via a bypass path, the current flowing due to the rapid change. Accordingly, at least one protection circuit 136 may function as an electro-static discharge circuit (ESD circuit). The at least one protection circuit 136 may prevent the amplifier 137 from being affected by a change in the first voltage caused by the second power supply 310 or an external factor occurring between the second power supply 310 and the amplifier 137. In particular, the at least one protection circuit 136 may prevent the voltage level of the power input terminal PIN of the amplifier 137 from being affected by the change in the first voltage.

According to an embodiment, the first pixel 220 may be connected to the one or more amplifier circuits 137 of the first source driver 130 receiving electric power from the second power supply 310. The first pixel 220 may receive the data voltage from the one or more amplifier circuits 137. The first pixel 220 may be connected to any one of the gate drivers 120 receiving electric power from the first power supply 190. The first power supply 190 may be different from the second power supply 310. The first pixel 220 may receive the gate voltage from the gate driver 120.

If the gate driver 120 receives electric power from the first power supply 190, the second voltage, which is a voltage whose magnitude is different from that of the first voltage generated in the second power supply 310 and supplied to the source driver 130, may be supplied to the gate driver 120. Accordingly, driving performance of the gate driver 120 may be improved.

In addition, since the first power supply 190 and the second power supply 310 are different from each other, the at least one protection circuit 136 according to an embodiment may be separated from the gate driver 120. If the at least one protection circuit 136 is separated from the gate driver 120, it is possible to more reliably protect the one or more amplifier circuits 137 disposed inside the source driver 136 such that the one or more amplifier circuits 137 is not affected by the change in the voltage of the first power supply 190 supplying electric power to the gate driver 120.

Figure 2:
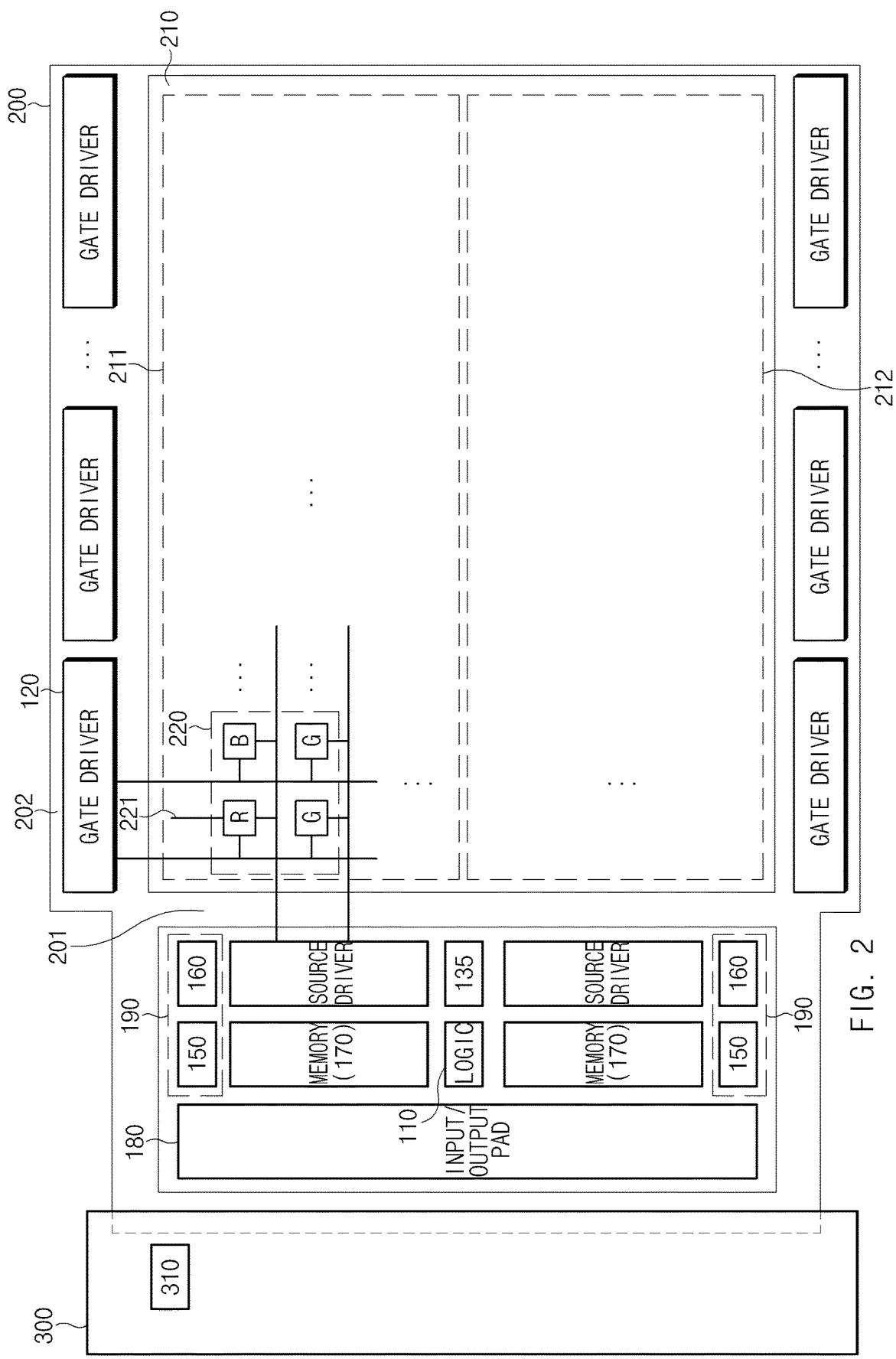
FIG. 2 is a detailed block diagram illustrating the display driver integrated circuit, the display panel, and a printed circuit board (PCB) according to an embodiment.

FIG. 2 is a detailed block diagram illustrating the display driver integrated circuit 100, the display panel 200, and a printed circuit board (PCB) 300 according to an embodiment. The PCB 300 may be a flexible printed circuit board (FPCB). The FPCB may be bent to the back surface of the display panel 200.

According to an embodiment, the display driver integrated circuit 100 may further include a logic circuit 110, a gamma block 135, a storage unit (memory) 170, and an input/output pad 180.

The logic circuit 110 may be a timing controller that supplies a plurality of timing signals setting first image data displaying an image and an operation timing of the source driver 130. The logic circuit 110 may receive control information and the first image data from a processor (e.g., application processor). The control information may mean data capable of controlling components included in the display driver integrated circuit 100 or selecting the first image data. The first image data may mean data related to an image output through the display panel 200.

The logic circuit 110 may generate a clock based on the control information. The clock may mean an electric vibration applied to the components included in the display driver integrated circuit 100 (e.g., the gate driver 120 and the source driver 130) in order to operate the components at a constant speed. The above components may operate based on the clock generated by the logic circuit 110.

The logic circuit 110 may generate a gate control signal (GCS) for controlling the gate driver 120. The gate control signal may include a signal for controlling a point in time at which the gate driver 120 applies voltage to the gate lines, a signal for controlling a period for applying the voltage, and the like.

The logic circuit 110 may transmit the first image data to the source driver 130. The source driver 130 may convert the first image data into second image data. The second image data may mean data obtained by parallelizing the first image data.

The gamma block 135 may generate a grayscale voltage using gamma data stored in an internal register. The grayscale voltage may mean a voltage for correcting the sensitivity of the eyes of the user. For example, even if the brightness of the light emitted from the pixel changes linearly, the user may feel the change in brightness of light non-linearly. The grayscale voltage may mean a voltage for correcting the above-described nonlinear characteristics.

The storage unit 170 may store the image data acquired from the logic circuit 110. The storage unit 170 may align the stored image data in output order. The storage unit 170 may sequentially output the aligned image data to the source driver 130.

The input/output pad 180 may be connected to the PCB 300. The input/output pad 180 may receive electric power from the PCB 300. The input/output pad 180 may obtain a plurality of control signals and a plurality of data signals from the PCB 300.

According to an embodiment, the first power supply 190 inside the display driver integrated circuit 100 may include a step-up circuit 150 and a regulator 160.

The step-up circuit 150 may receive the first voltage from the second power supply 310. The step-up circuit 150 may increase the magnitude of the first voltage supplied by the second power supply 310 by using a DC-DC conversion circuit, such as a boost-converter, or a charge pump circuit including a capacitor and a switching element. The step-up circuit 150 may output, to the regulator 160, the voltage of the increased magnitude.

The regulator 160 may receive the voltage of the increased magnitude from the step-up circuit 150. The regulator 160 may regulate the magnitude of the received voltage to correspond to the magnitude of a driving voltage of the gate driver 120. The regulator 160 may generate the second voltage corresponding to the magnitude of the driving voltage of the gate driver 120. The regulator 160 may supply the second voltage to the gate driver 120.

According to an embodiment, the plurality of pixels 220 may be classified into a plurality of pixel groups 211 and 212 for the first edge 201. Each of the plurality of pixel groups 211 and 212 may receive a data voltage from each of the plurality of source drivers 130. The plurality of source drivers 130 may respectively correspond to the plurality of pixel groups 211 and 212. For example, the first source driver 130 may correspond to the first pixel group 211 and supply the data voltage to the pixels 220 included in the first pixel group 211.

According to an embodiment, each of the plurality of pixels 220 may include a plurality of sub-pixels R, G, and B. As illustrated in FIG. 2, one pixel 220 may include four sub-pixels R, G, B, and G. Alternatively, one pixel 220 may include three sub-pixels R, G, and B. Alternatively, one pixel 220 may include four sub-pixels R, G, B, and W.

If one pixel 220 includes four sub-pixels R, G, B, and G, they may be disposed two by two to form two columns for each pixel 220 such that the four sub-pixels R, G, B, and G are arranged in a pentile form. If one pixel 220 includes the four sub-pixels R, G, B, and G, a plurality of sub-pixels R, G, B, and G may include a red sub-pixel R, a first green sub-pixel G, a blue sub-pixel B, and a second green sub-pixel G.

The red sub-pixel R may be disposed adjacent to one vertex in one pixel 220. The red sub-pixel R may emit red light to represent the red component in one pixel 220.

The first green sub-pixel G may be adjacent to the red sub-pixel R in the longitudinal direction of the first edge 201. The first green sub-pixel G may emit green light to represent the green component in one pixel 220.

The blue sub-pixel B may be adjacent to the red sub-pixel R in the longitudinal direction of the second edge 202. The blue sub-pixel B may emit blue light to represent the blue component in one pixel 220.

The second green sub-pixel G may be adjacent to the blue sub-pixel B in the longitudinal direction of the first edge 201. The second green sub-pixel G may emit green light to represent the green component in one pixel 220.

If one pixel 220 includes three sub-pixels R, G, and B, the three sub-pixels may be disposed to form one column for each pixel 220 such that the three sub-pixels R, G, and B are arranged side by side. If one pixel 220 includes the three sub-pixels R, G, and B, a plurality of sub-pixels R, G, and B may include a red sub-pixel R, a green sub-pixel G, and a blue sub-pixel B.

The red sub-pixel R may be disposed adjacent to one side edge in one pixel 220. The red sub-pixel R may emit red light to represent the red component in one pixel 220.

The green sub-pixel G may be adjacent to the red sub-pixel R in the longitudinal direction of the first edge 201. The green sub-pixel G may emit green light to represent the green component in one pixel 220.

The blue sub-pixel G may be adjacent to the green sub-pixel G in the longitudinal direction of the first edge 201. The blue sub-pixel B may emit blue light to represent the blue component in one pixel 220.

If one pixel 220 includes four sub-pixels R, G, B, and W, they may be disposed two by two to form two columns for each pixel 220 such that the four sub-pixels R, G, B, and W are arranged in a pentile form. Alternatively, if one pixel 220 includes four sub-pixels R, G, B, and W, the four sub-pixels may be disposed to form one column for each pixel 220 such that the four sub-pixels R, G, B, and W are arranged side by side. The plurality of subpixels R, G, B, and G may include a red subpixel R emitting red light, a green sub-pixel G emitting green light, a blue sub-pixel B emitting blue light, and a white sub-pixel W emitting white light.

According to an embodiment, the PCB 300 may include the second power supply 310. The PCB 300 may be connected to the display circuit 100. Accordingly, the second power supply 310 may supply electric power to the source driver 130.

According to an embodiment, the first edge 201 on which the display driver integrated circuit 100 is disposed may be bent toward the back surface of the display panel 200. The bending of the first edge 201 makes it possible for the display driver integrated circuit 100 and the PCB 300 to be disposed on the back surface of the display panel 200.

Figure 3:
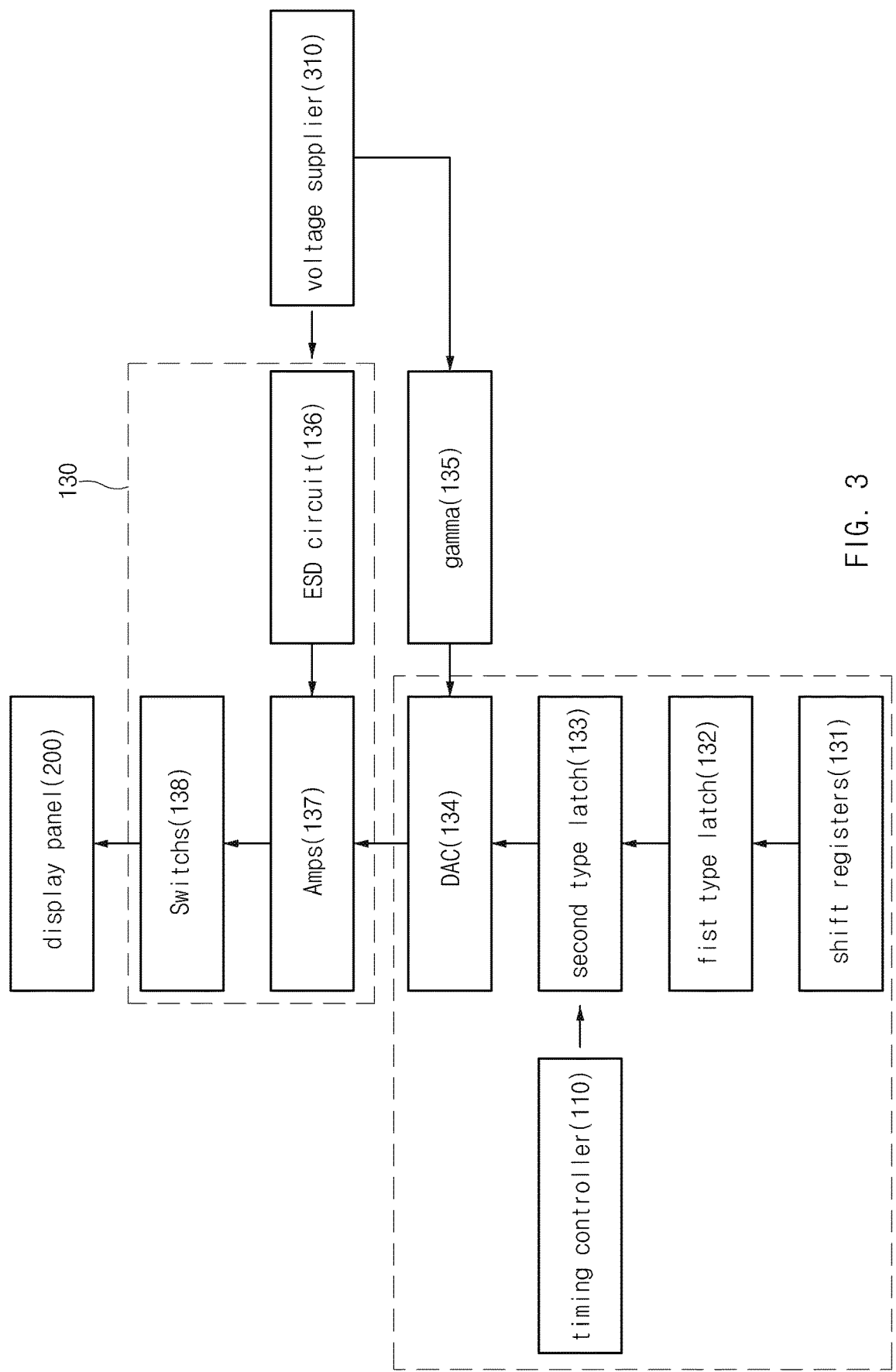
FIG. 3 is a detailed block diagram illustrating a source driver according to an embodiment.

FIG. 3 is a detailed block diagram illustrating the source driver 130 according to an embodiment. Referring to FIG. 3, the source driver 130 may include the protection circuit 136, the amplifier circuit 137, and a switch 138. In addition, according to an embodiment, the source driver 130 may include the logic circuit 110 for supplying signals and electric power to the source driver 130, a shift register 131, a first type latch 132, a second type latch 133, a decoder 134 (digital-analog decoder), a gamma block 135, and the second power supply 310.

The shift register 131 may acquire first image data from the logic circuit 110. The shift register 131 may convert the first image data into second image data.

The first type latch 132 may sequentially store the second image data received from the shift register 131. For example, the first type latch 132 may store image data to be output on the left side of an N line 201 and image data to be output on the right side in this order. Alternatively, the reverse order may also possible. When all image data corresponding to the N line is stored, the first type latch 132 may store image data to be output through the N+1 line. At this time, the first type latch 132 may store image data to be output on the left side of the N+1 line and image data to be output on the right side in this order. Alternatively, the reverse order may also possible.

While the first type latch 132 stores image data for each line, the second type latch 133 may transmit the image data of the corresponding line to the decoder 134. For example, while the first type latch 132 stores image data of the N line, the second type latch 133 may transmit the image data of the N line stored in the first type latch 132 to the decoder 134. In another embodiment, while the first type latch 132 stores image data of the N+1 line, the second type latch 133 may transmit the image data of the N+1 line 202 stored in the first type latch 132 to the decoder 134.

The gamma block 135 may apply the grayscale voltage to the decoder 134. The decoder 134 may convert the image data received from the second type latch 133 into a data voltage based on the grayscale voltage received from the gamma block 135. The data voltage is a voltage applied to the pixels 220, and may charge a capacitive element (e.g., a capacitor) included in the pixels 220. The gamma block 135 may be driven by receiving electric power from the second power supply 310.

The protection circuit 136 may transmit the first voltage supplied from the second power supply 310 to the power input terminal PIN of the amplifier circuit 137 while maintaining the first voltage within a normal range. The protection circuit 136 may prevent electro-static discharging (ESD) due to static electricity introduced from the second power supply 310. In addition, the protection circuit 136 may protect the display driver integrated circuit 100 from overcurrent flowing in the reverse direction, which is the direction from the display panel 200 to the display driver integrated circuit 100. Accordingly, in the present disclosure, the protection circuit 136 may be referred to as an electro-static discharge circuit (ESD circuit).

The amplifier circuit 137 may output the data voltage received from the decoder 134 to the display panel 200. For example, if the data voltage applied to the input terminal of the amplifier circuit 137 (e.g., a terminal between the decoder 134 and the amplifier circuit 137) reaches a predetermined level or more, the amplifier circuit 137 may output the data voltage of the predetermined level or more.

The switch 138 may be opened or closed, thereby adjusting the timing at which the data voltage is output to the display panel 200. For example, if the switch 138 is opened, the data voltage may not be transmitted to the display panel 200, and if the switch 138 is closed, the data voltage may be transmitted to the display panel 200. In the present disclosure, the switch 138 may be referred to as the source output switch 138.

According to an embodiment of the present disclosure, even if a change in the first voltage supplied from the second power supply 310 occurs due to the static electricity introduced between the second power supply 310 and the amplifier circuit 137, and so on, it is possible to prevent the amplifier circuit 137 from being affected by the change in the first voltage. If the amplifier circuit 137 is not affected by the abnormal change in the first power supply 310, the amplifier circuit 137 may be driven by using the first voltage maintaining a constant magnitude as a bias to output a normal data voltage. Accordingly, the data driver 130 may supply a normal data voltage to the display panel 200.

In the present disclosure, the details described with reference to FIGS. 1 to 3 may be equally applied to components having the same reference signs as those of the display driver integrated circuit 100 and the display panel 200 illustrated in FIGS. 1 to 3.

Figure 4:
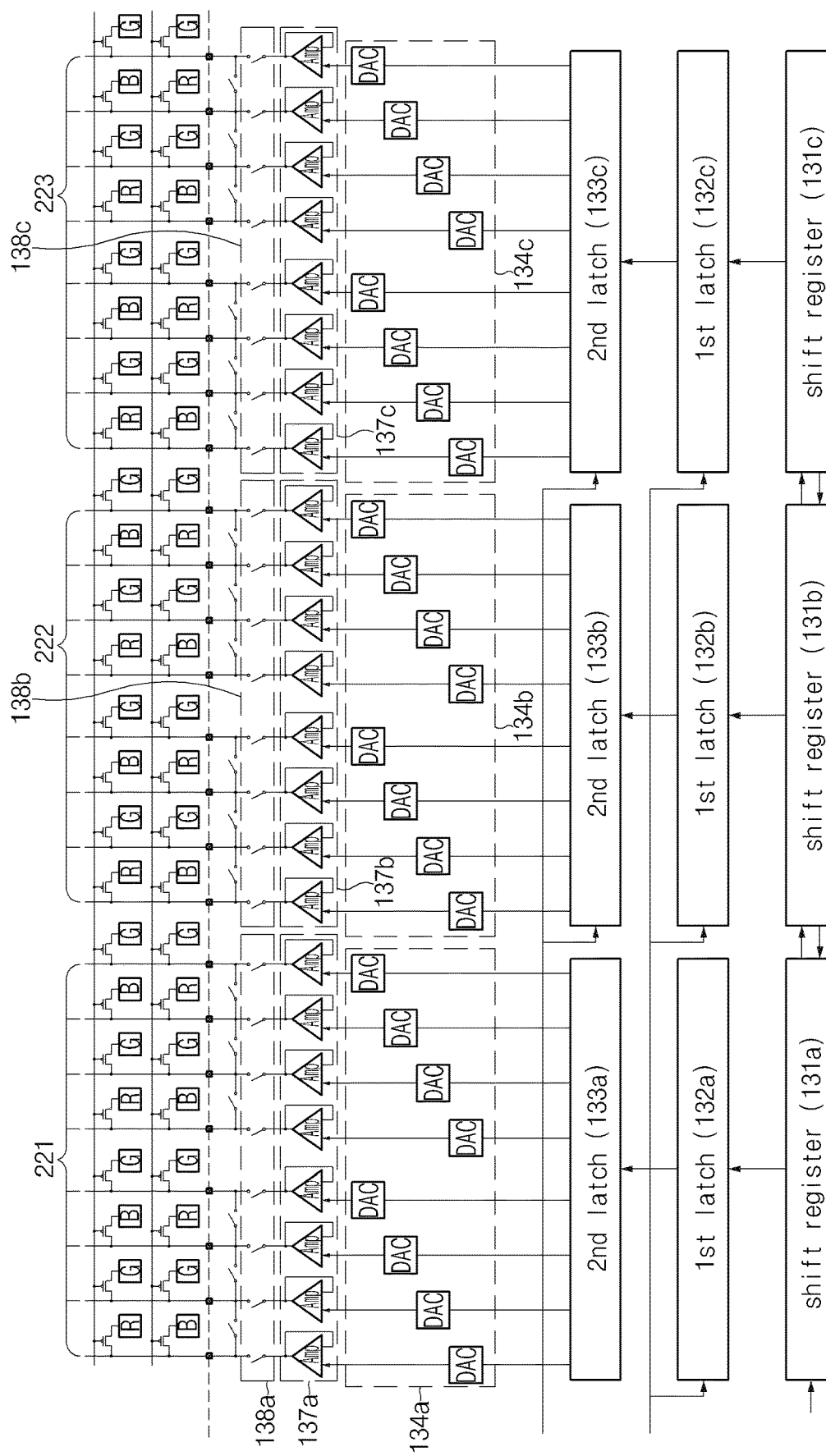
FIG. 4 is a circuit diagram illustrating the display panel and the source driver according to an embodiment.

FIG. 4 illustrates an enlarged diagram of the display panel 200 and the source driver 130 according to an embodiment. FIG. 4 illustrates an enlarged diagram of a coupling relationship between lines disposed on the display panel 200 and the source driver 130.

Referring to FIG. 4, the source driver 130 may include a plurality of shift registers 131a, 131b, and 131c, first type latches 132a, 132b, and 132c, and second type latches 133a, 133b, and 133c, decoders 134a, 134b, and 134c, amplifier circuits 137a, 137b, and 137c, and switches 138a, 138b, and 138c. Eight decoders 134a may be connected to one second type latch (e.g., 133a), and one amplifier circuit may be connected to each decoder. One switch may be connected to each amplifier circuit, and each switch may be connected to one sub-pixel. The above-described connection relationship is exemplary, and the scope of the embodiments of the present disclosure are not limited to the connection relationship illustrated in FIG. 3. For example, six decoders may be connected to one second type latch (e.g., 133a).

The shift registers 131a, 131b, and 131c may convert the first image data received from the timing controller 110 into second image data.

The first type latches 132a, 132b, and 132c may receive the second image data from the shift registers 131a, 131b, and 131c and store the second image data for each line. For example, the first type latches 132a, 132b, and 132c may store image data corresponding to the N line, and then store image data corresponding to the N+1 line.

The second type latches 133a, 133b, and 133c may transmit, to the decoders 134a, 134b, and 134c, the image data stored in the first type latches 132a, 132b, and 132c while the first type latches 132a, 132b, and 132c store image data for each line. For example, the first type latch 132a may store part of the image data corresponding to the N line which is to be output through first data lines 221. Then, the first type latch 132b may store other part of the image data corresponding to the N line which is to be output through second data lines 222. At this time, the second type latch 133a may transmit, to the decoders 134a, the image data which is to be output through the first data lines 221. In other words, while the first type latch 132b stores the image data which is to be output through the second data lines 222, the second type latch 133a may transmit, to the decoders 134a, the image data which is to be output through the first data lines 221. The decoders 134a may convert the image data which is to be output through the first data lines 221 into a data voltage, based on the grayscale voltage received from the gamma block 135.

The above description may also be applied to an operation in which the first type latch 132c stores image data to be output through third data lines 223. That is, while the first type latch 132c stores the image data which is to be output through the third data lines 223, the second type latch 132b may transmit, to the decoders 134a, the image data which is to be output through the second data lines 222. The decoders 134b may convert the image data which is to be output through the second data lines 222 into a data voltage, based on the grayscale voltage received from the gamma block 135.

If the voltage of the input terminals increases more than a certain level, the amplifier circuits 137a, 137b, and 137c may output the data voltage to the switches 138a, 138b, and 138c.

The switches 138a, 138b, and 138c may be opened or closed, thereby adjusting the timing at which the data voltage is output to the display panel 200. For example, if the switches 138a are closed, the data voltage may be transmitted to the sub-pixels connected to the N line and the first data lines. In another embodiment, if the switches 138b are closed, the data voltage may be transmitted to the sub-pixels connected to the N line and the second data lines.

If the processing of the image data corresponding to the N line is finished, the first type latch 132a may store part of the image data corresponding to the N+1 lines which is to be output through the first data lines. Then, the first type latch 132b may store other part of the image data corresponding to the N+1 line which is to be output through the second data lines 222. At this time, the second type latch 133a may transmit, to the decoders 134a, the image data which is to be output through the first data lines 221. In other words, while the first type latch 132b stores the image data which is to be output through the second data lines 222, the second type latch 132a may transmit, to the decoders 134a, the image data which is to be output through the first data lines 221. The decoders 134a may convert the image data which is to be output through the first data lines 221 into a data voltage, based on the grayscale voltage received from the gamma block 135.

The above process may also be applied to an operation in which the first type latch 132c stores image data to be output through the third data lines 223. That is, while the first type latch 132c stores the image data which is to be output through the third data lines 223, the second type latch 132b may transmit, to the decoders 134a, the image data which is to be output through the second data lines 222. The decoders 134b may convert the image data which is to be output through the second data lines 222 into a data voltage, based on the grayscale voltage received from the gamma block 135.

Figure 5:
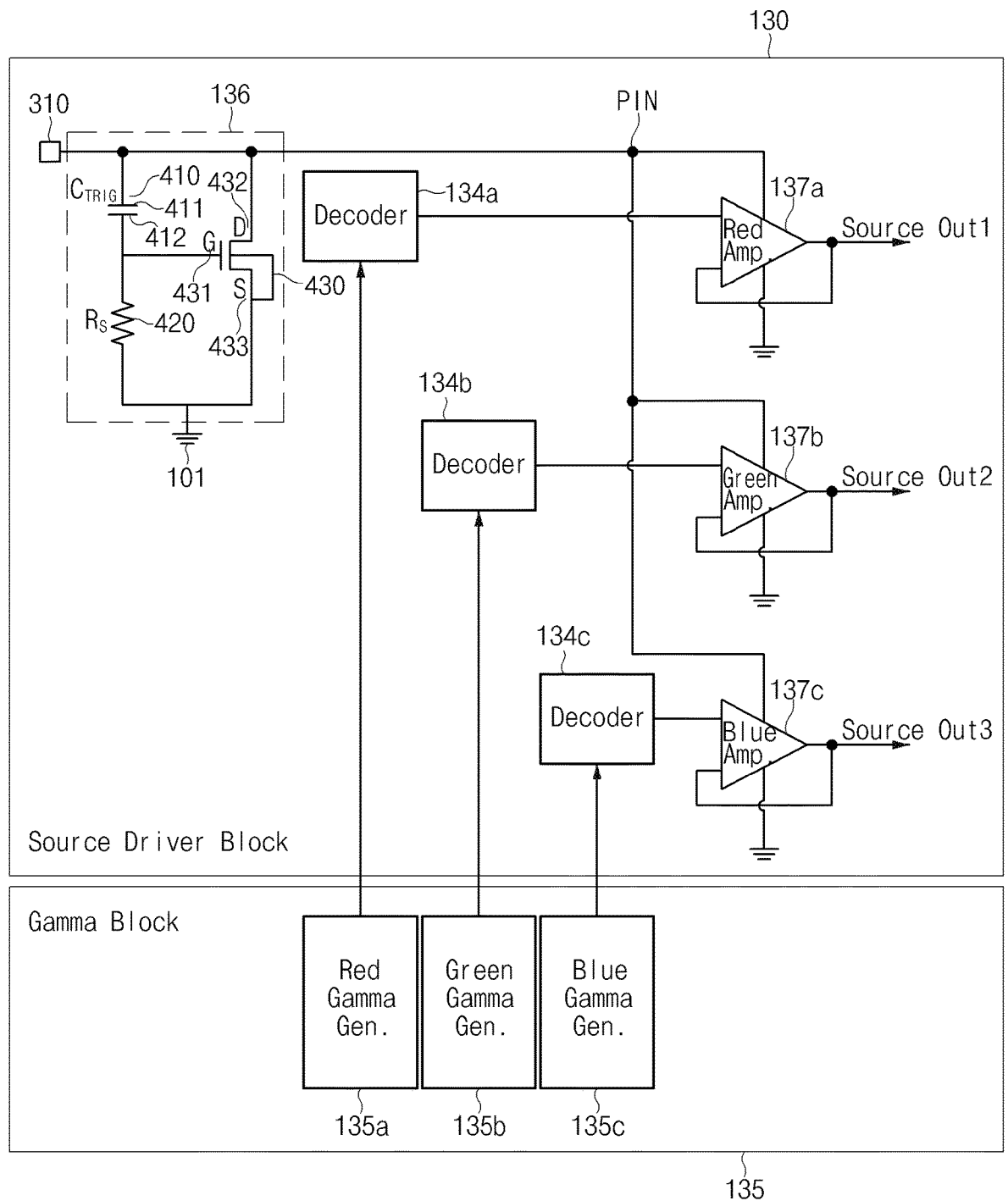
FIG. 5 is a detailed circuit diagram illustrating a protection circuit according to an embodiment.

FIG. 5 is a detailed circuit diagram illustrating the protection circuit 136 according to an embodiment. The protection circuit 136 may include a capacitor 410, a resistor 420, and a switching element 430.

The capacitor 410 may have a first terminal 411 and a second terminal 412. The first terminal 411 of the capacitor 410 may be connected to the second power supply 310. The first terminal 411 may be connected to the one or more amplifier circuits 137. The first terminal 411 may be connected to a line branched from a line connecting the second power supply 310 and the power input terminal PIN of the one or more amplifier circuits 137. The second terminal 412 may be connected to the resistor 420.

The capacitor 410 may acquire the first voltage of the second power supply 310 at the first terminal 411. The capacitor 410 may keep constant the difference between the voltage of the first terminal 411 and the voltage of the second terminal, when the magnitude of the first voltage changes rapidly. The capacitor 410 may change the voltages of the first terminal 411 and the second terminal 412 to correspond to the magnitude change of the first voltage. In the present disclosure, the capacitor 410 may be generalized as a filter element that blocks the rapid voltage change of the second power supply 310 from being transmitted to the one or more amplifier circuits 137.

The resistor 420 may be connected to the second terminal 412 of the capacitor 410. The resistor 420 may be connected to the ground 101. The resistor 420 may be disposed between the second terminal 412 of the capacitor 410 and the ground 101.

The switching element 430 may be implemented as a metal oxide semiconductor field effect transistor (MOSFET). The switching element 430 may include a gate terminal 431, a drain terminal 432, and a source terminal 433.

The gate terminal 431 may be connected to the second terminal 412 of the capacitor 410. The gate terminal 431 may be connected to a resistor 420. The gate terminal 431 may be connected to a line connecting the second terminal 412 of the capacitor 410 and the resistor.

The drain terminal 432 may be connected to the first terminal 411 of the capacitor 410. The drain terminal 432 may be connected to a line branched from a line connecting the first power supply 310 and the power input terminal PIN of the one or more amplifier circuits 137. The source terminal 433 may be connected to the ground 101.

The gate terminal 431 may receive the voltage of the second terminal 412 of the capacitor 410. The gate terminal 431 may sense a voltage change of the second terminal 412. The gate terminal 431 may turn on the switching element 430 in response to the voltage change of the second terminal 412. If the difference between the voltage of the gate terminal 431 and the voltage of the source terminal 433 is greater than a threshold voltage of the switching element 430, the switching element 430 is turned on.

The switching element 430 may be turned on at least temporarily due to at least a temporary voltage change of the gate terminal 431. If the switching element 430 is turned on, the switching element 430 may electrically connect the drain terminal 432 and the source terminal 433. If the drain terminal 432 and the source terminal 433 are electrically connected, current may flow from the drain terminal 432 to the source terminal 433. The switching element 430 may allow the current due to at least a temporary change in voltage of the second power supply 310 to flow from the drain terminal 432 to the source terminal 433. The switching element 430 may discharge, to the ground 101, the current due to at least a temporary voltage change of the second power supply 310.

According to an embodiment, the switching element 430 may sense at least a temporary change in voltage of the power input terminal PIN at the gate terminal 431 through the capacitor 410. The switching element 430 may at least temporarily electrically connect the drain terminal 432 and the source terminal 433. If the drain terminal 432 and the source terminal 433 are electrically connected, current may flow and electric charges may be discharged to the ground 101 connected to the source terminal 433. The switching element 430 may discharge static electricity to the ground 101 by using a change in voltage which is at least temporarily induced in the gate terminal 431 through the capacitor 410 by the static electricity introduced into the power input terminal PIN.

According to an embodiment, each of the plurality of sub-pixels R, G, and B may be connected to the output terminal of each of the one or more amplifier circuits 137a, 137b, and 137c. If one pixel has the red sub-pixel, the green sub-pixel, and the blue sub-pixel disposed to be adjacent to each other in a direction parallel to the longitudinal direction of the source driver 130, the one or more amplifier circuits 137a, 137b, and 137c may include a red amplifier circuit 137a, a green amplifier circuit 137b, and a blue amplifier circuit 137c corresponding to the red sub-pixel, the green sub-pixel, and the blue sub-pixel, respectively.

A plurality of sub-pixels R, G, and B may receive a plurality of source outputs Source Out1, Source Out2, and Source Out3 from the output terminals of the one or more amplifier circuits 137a, 137b, and 137c. If the plurality of source outputs Source Out1, Source Out2, and Source Out3 are generated in the red amplifier circuit 137a, the green amplifier circuit 137b, and the blue amplifier circuit 137c, respectively, the plurality of source outputs Source Out1, Source Out2, and Source Out3 may be supplied to the red sub-pixel, the green sub-pixel, and the blue sub-pixel, respectively.

According to an embodiment, the protection circuit 136 may be connected to the power input terminal PIN of the one or more amplifier circuits 137a, 137b, and 137c. The power input terminal PIN of the one or more amplifier circuits 137a, 137b, and 137c may be a terminal separate from the image data input terminal of the amplifier circuits 137a, 137b, 137c. Accordingly, the protection circuit 136 may be disposed separately from the decoders 134a, 134b, and 134c connected to the image data input terminal of the amplifier circuit 137. In addition, the protection circuit 136 may be disposed separately from the gamma circuits 135a, 135b, and 135c inside the gamma block 135 that applies the grayscale voltage to the decoders 134a, 134b, and 134c.

If the protection circuit 136 is separated from the decoders 134a, 134b, and 134c and the gamma circuits 135a, 135b, and 135c, the protection circuit 136 may discharge static electricity introduced between the second power supply 310 and the power input terminal PIN of the one or more amplifier circuits 137a, 137b, and 137c. Accordingly, static electricity introduced between the second power supply 310 and the power input terminal PIN of the one or more amplifier circuits 137a, 137b, and 137c may be more reliably prevented from damaging the power input terminal PIN of the one or more amplifier circuits 137a, 137b, and 137c.

Figure 6:
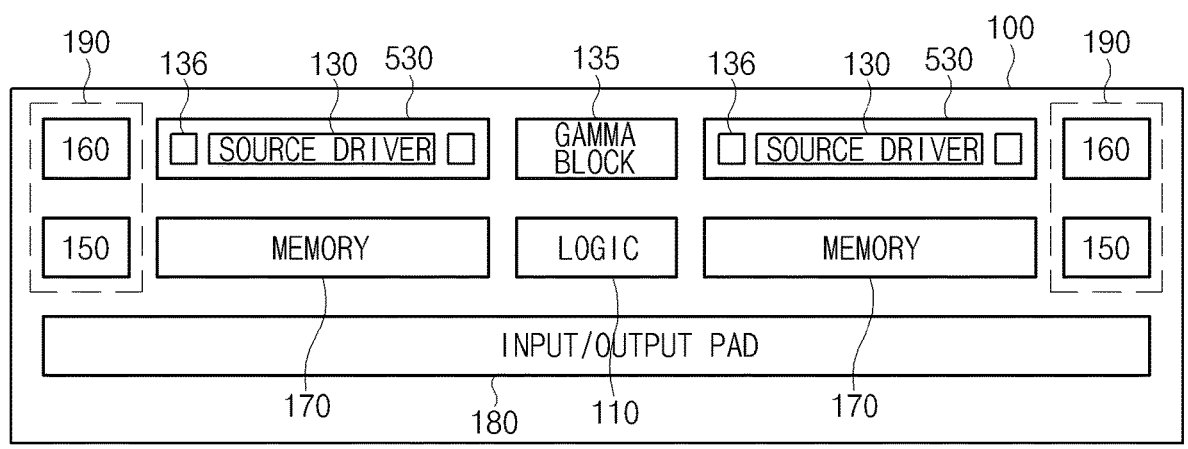
FIG. 6 is a detailed block diagram illustrating the display driver integrated circuit according to an embodiment.

FIG. 6 is a detailed block diagram illustrating the display driver integrated circuit 100 according to an embodiment.

According to an embodiment, the logic circuit 110 may be disposed in the central portion of the display driver integrated circuit 100. Memories 170 may be disposed on both sides of the logic circuit 110. The logic circuit 110 may control the source driver 130 using a plurality of signals provided from the input/output pad 180. The logic circuit 110 may store image data provided from the input/output pad 180 in the memories 170.

According to an embodiment, the first power supplies 190 may be disposed at both side edges of the display driver integrated circuit 100. The first power supply 190 may include the step-up circuit 150 and the regulator 160. The step-up circuit 150 may be adjacent to the input/output pad 180 to receive electric power from the input/output pad 180. The step-up circuit 150 may increase the magnitude of the input voltage. The regulator 160 may regulate the magnitude of the voltage increased by the step-up circuit 150 and output it.

According to an embodiment, the at least one protection circuit 136 may be disposed to be adjacent to the source driver 130. The at least one protection circuit 136 may be disposed at both side edges of the source driver 130.

If the at least one protection circuit 136 is disposed on both side edges of the source driver 130 and the source driver 130 on one integrated circuit chip, one integrated driving chip 530 (combined driving chip) may be provided. If the at least one protection circuit 136 is located together with the source driver 130 on one integrated driving chip 530, the at least one protection circuit 136 may be disposed on the dummy area not previously used in the source driver 130. Accordingly, an area occupied by the at least one protection circuit 136 may be minimized.

Alternatively, in order to increase the physical size of at least one protection circuits 136 disposed at both side edges of the source driver 130, the at least one protection circuit 136 may be implemented as a separate circuit or a separate chip. If the physical size of the at least one protection circuit 136 is increased, the at least one protection circuit 136 may make it easier to flow a current to prevent a change in the magnitude of the voltage provided to the source driver 130. In particular, if the width of the switching element 430 included in the at least one protection circuit 136 is increased, the magnitude of the current flowing in the at least one protection circuit 136 may be increased. Accordingly, it is possible to discharge electric charges caused by static electricity introduced into the source driver 130 more quickly, and in turn, to prevent the inside of the source driver 130 from being damaged due to static electricity.

Figure 7:
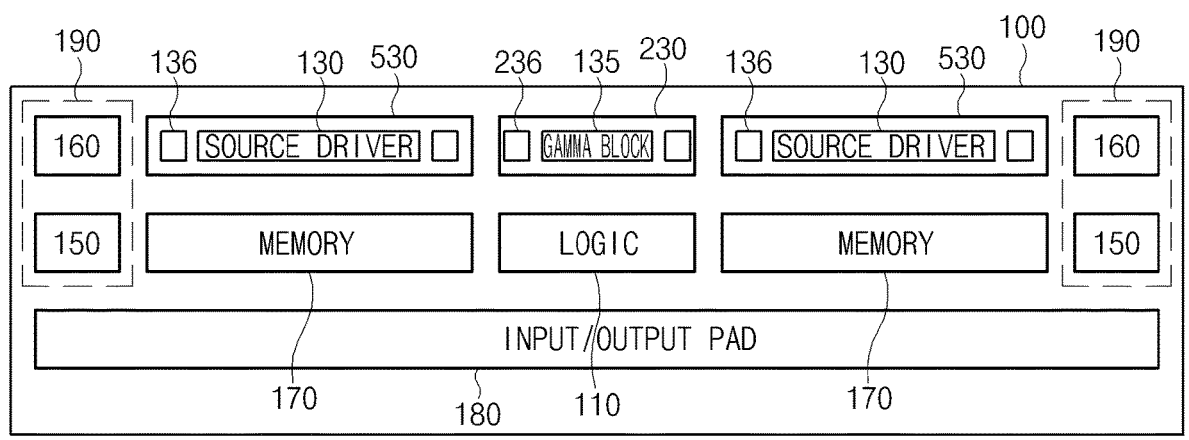
FIG. 7 is a detailed block diagram illustrating a display driver integrated circuit according to another embodiment.

FIG. 7 is a detailed block diagram illustrating a display driver integrated circuit 100 according to another embodiment. The display driver integrated circuit 100 according to another embodiment may have the same configuration and function as the display driver integrated circuit 100 described with reference to FIG. 6 excluding an integrated gamma chip 230 and a second protection circuit 236. Hereinafter, the description of the components other than the integrated gamma chip 230 and the second protection circuit 236 will not be repeated.

The integrated gamma chip 230 may include the gamma block 135 and the second protection circuits 236. The second protection circuits 236 may be disposed on both side edges of the gamma block 135. The second protection circuits 236 may have the same configuration as the protection circuits 136 disposed on both side edges of the source driver 130. The second protection circuit 236 may keep constant the voltage supplied to the gamma block 135. In particular, the second protection circuit 236 may discharge static electricity introduced into the gamma block 135. The second protection circuit 236 may include the same components as the protection circuit 136 and may have the same function as the protection circuit 136.

If the second protection circuit 236 is disposed to be adjacent to the gamma block 135, it is possible to prevent the phenomenon that the input terminal of a circuit receiving electric power to generate the gamma voltage in the gamma block 135 is damaged due to a sudden change in voltage or an introduction of static electricity. In addition, if the second protection circuit 236 is disposed on the same chip as the gamma block 135, an increase in the size of the integrated gamma chip 230 including the gamma block 135 may be minimized.

Figure 8:
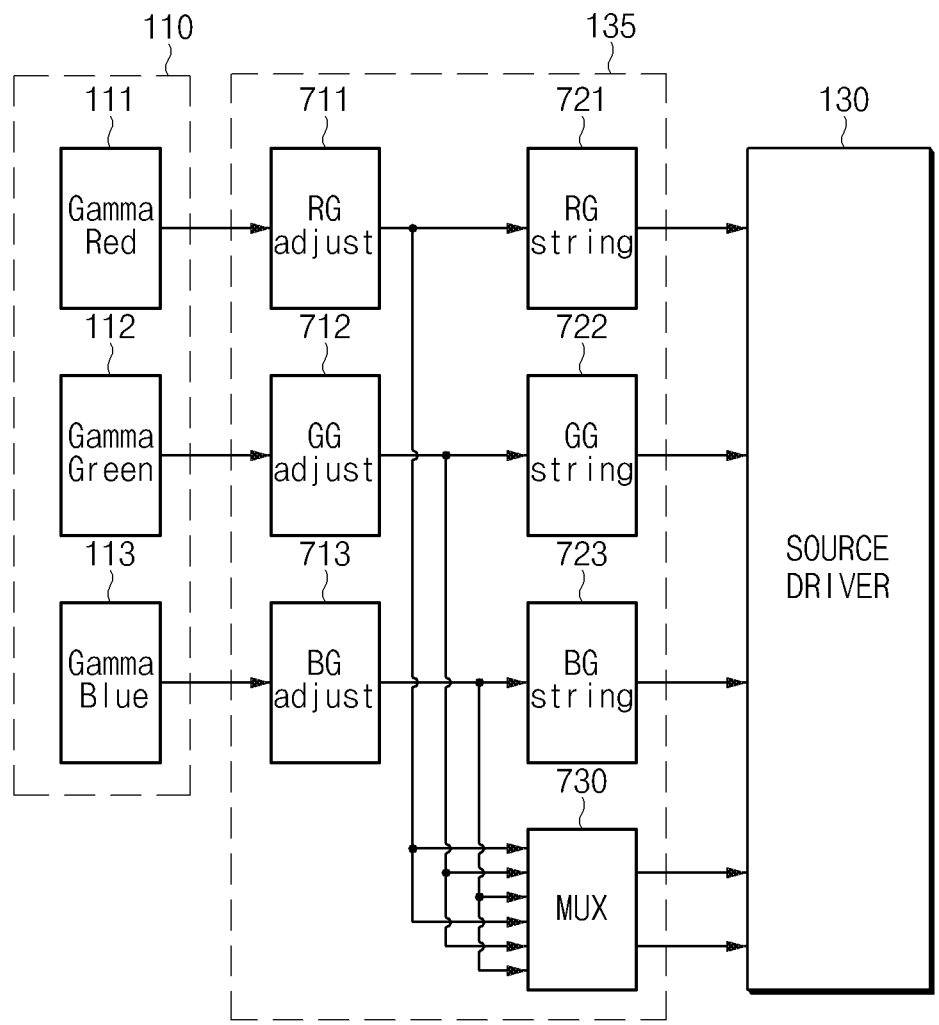
FIG. 8 is a detailed circuit diagram illustrating a gamma block according to an embodiment.

FIG. 8 is a detailed circuit diagram illustrating the gamma block 135 according to an embodiment. The gamma block 135 may include a plurality of gamma adjustment circuits 711, 712, and 713, a plurality of gamma string circuits 721, 722, and 723, and a multiplexer 730.

A plurality of gamma registers 111, 112, and 113 may be included in the logic circuit 110. The plurality of gamma registers 111, 112, and 113 may include a red gamma register 711, a green gamma register 712, and a blue gamma register 713. The plurality of gamma registers 111, 112, and 113 may store a plurality of gamma values. The plurality of gamma values may include a red gamma value, a green gamma value, and a blue gamma value. Each of the red gamma value, the green gamma value, and the blue gamma value may include data capable of representing grayscale values of red, green, and blue.

The plurality of gamma adjustment circuits 711, 712, and 713 may receive a plurality of gamma values from the plurality of gamma registers 111, 112, and 113. The red gamma adjustment circuit 711 may receive a red gamma value from the red gamma register 111. The green gamma adjustment circuit 712 may receive a green gamma value from the green gamma register 112. The blue gamma adjustment circuit 713 may receive a blue gamma value from the blue gamma register 113.

The plurality of gamma adjustment circuits 711, 712, and 713 may generate a plurality of gamma reference voltages using the plurality of gamma values. The plurality of gamma reference voltages are voltages having preset magnitudes in order to represent the plurality of gamma values in an image. For example, if the plurality of gamma reference voltages include voltages having 10 levels for each color, the plurality of gamma adjustment circuits 711, 712, and 713 may generate and output a gamma reference voltage corresponding to an input gamma value among the gamma reference voltages having 10 different magnitudes for each color, in order to represent the input gamma value in an image.

The plurality of gamma string circuits 721, 722, and 723 may receive the plurality of gamma reference voltages from the plurality of gamma adjustment circuits 711, 712, and 713. The red gamma string circuit 721 may receive a red gamma reference voltage from the red gamma adjustment circuit 711. The green gamma string circuit 722 may receive a green gamma reference voltage from the green gamma adjustment circuit 712. The blue gamma string circuit 723 may receive a blue gamma reference voltage from the blue gamma adjustment circuit 713.

The plurality of gamma string circuits 721, 722, and 723 may output a plurality of gamma voltages using the plurality of gamma reference voltages. The plurality of gamma voltages may be provided to the source driver 130. The plurality of gamma voltages may finely control the grayscale values represented by the data voltages. For example, grayscale values may be divided into 256 level values ranging from 0 to 255 using the gamma voltages. The plurality of gamma string circuits 721, 722, and 723 may divide the plurality of gamma voltages into the number of levels higher than the number of the plurality of gamma reference voltages. In the present disclosure, the plurality of gamma voltages may be referred to as grayscale voltages since the gamma voltages are capable of finely representing the grayscale values.

The multiplexer 730 may receive the plurality of gamma reference voltages from the plurality of gamma adjustment circuits 711, 712, and 713. The multiplexer 730 may generate bit data using the plurality of gamma reference voltages. The bit data may determine the position and order of bits included in image data, which is data outputting data voltages. For example, the bit data may determine a position and order from a most significant bit (MSB) to a least significant bit (LSB) among a plurality of bits. The multiplexer 730 may supply the bit data to the source driver 130.

The display driver integrated circuit 100 according to another embodiment may keep constant the voltage level between the second power supply 310 and the power input terminal of the plurality of gamma string circuits 721, 722, and 723, using the second protection circuit 236. For example, the second protection circuit 236 may discharge static electricity introduced between the second power supply 310 and the power input terminal of the plurality of gamma string circuits 721, 722, and 723. Accordingly, a voltage having a constant magnitude may be provided to the power input terminal of the plurality of gamma string circuits 721, 722, and 723. In addition, it is possible to prevent the plurality of gamma string circuits 721, 722, and 723 from being damaged by a sudden change in voltage of the second power supply 310 or the introduction of static electricity.

Figure 9:
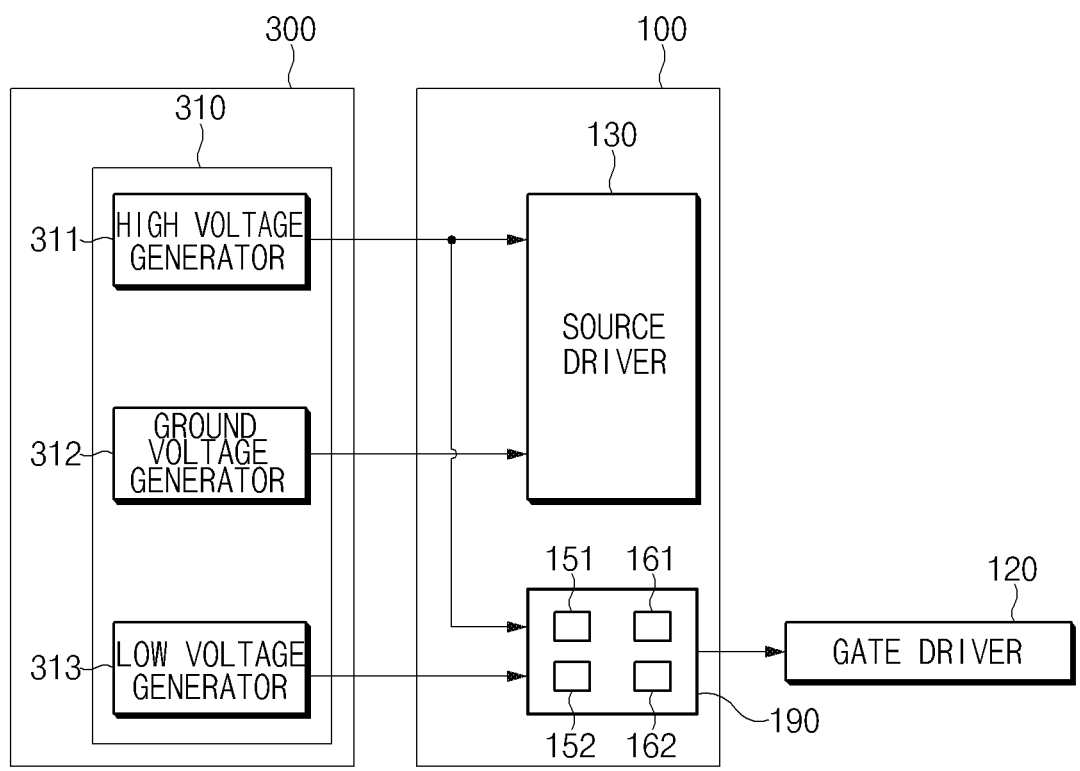
FIG. 9 is a schematic block diagram illustrating a first power supply and a second power supply according to an embodiment.

FIG. 9 is a schematic block diagram illustrating the first power supply 190 and the second power supply 310 according to an embodiment.

The second power supply 310 may be included in the PCB 300. The second power supply 310 may include a plurality of voltage generators 311, 312, and 313. Each of the plurality of voltage generators 311, 312, and 313 may generate a voltage having a set magnitude. The plurality of voltage generators 311, 312, and 313 may include a high voltage generator 311, a ground voltage generator 312, and a low voltage generator 313. The high voltage generator 311, the ground voltage generator 312, and the low voltage generator 313 may be provided independently of each other. Each of the high voltage generator 311, the ground voltage generator 312, and the low voltage generator 313 may be separately disposed and thus may be physically and electrically different.

The high voltage generator 311 may generate a first voltage. The first voltage may be a high voltage provided to the power input terminal PIN of the amplifier circuit 137 included in the source driver 130. The magnitude of the high voltage may be 5 V or more and 10 V or less. The high voltage generator 311 may supply the first voltage to the source driver 130. In addition, the first voltage generator 311 may supply the first voltage to the first power supply 190 included in the display driver integrated circuit 100.

The ground voltage generator 312 may generate a ground voltage. The ground voltage may be a voltage provided to the ground 101 included in the source driver 130. The magnitude of the ground voltage may be −2 V or more and 2 V or less. The second voltage generator 312 may supply the ground voltage to the source driver 130.

The low voltage generator 313 may generate a third voltage. The third voltage may be a voltage having a level different from the first voltage. The third voltage may be a low voltage having a magnitude greater than the ground voltage and smaller than the high voltage. The magnitude of the low voltage may be 2 V or more and 5 V or less. The low voltage generator 313 may supply electric power to the first power supply 190 using the third voltage.

The first power supply 190 may include a plurality of step-up circuits 151 and 152 and a plurality of regulators 161 and 162. The first power supply 190 may generate a positive voltage and a negative voltage whose magnitudes are the sum of the magnitude of the first voltage and the magnitude of the third voltage, using the plurality of step-up circuits 151 and 152. The first power supply 190 may use the plurality of regulators 161 and 162 to regulate the voltage of an increased magnitude to the second voltage. The first power supply 190 may output the second voltage to the gate driver 120.

Figure 10:
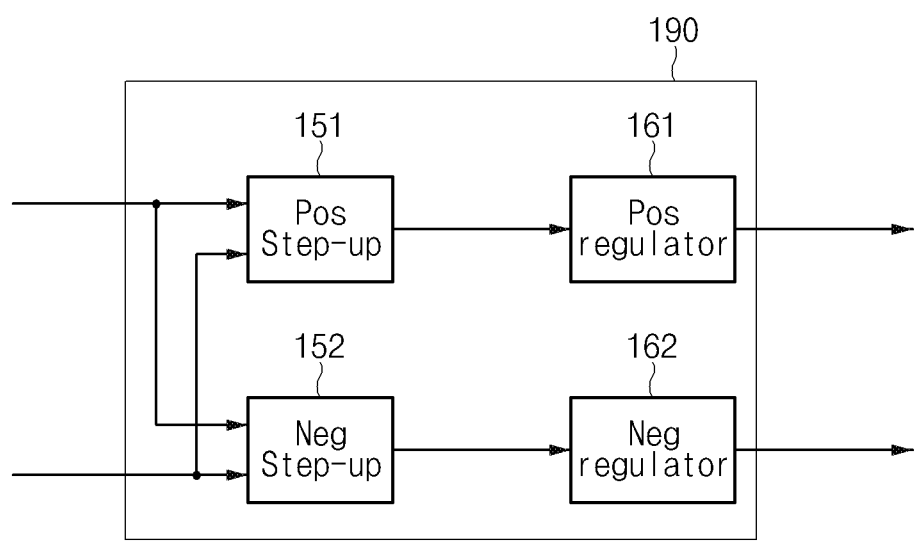
FIG. 10 is a detailed block diagram illustrating the first power supply according to an embodiment.

FIG. 10 is a detailed block diagram illustrating the first power supply 190 according to an embodiment. The first power supply 190 may include the positive step-up circuit 151, the negative step-up circuit 152, the positive regulator 161, and the negative regulator 162.

The positive step-up circuit 151 may receive the first voltage and the third voltage. The positive step-up circuit 151 may use a voltage converter such as a boost converter to generate a positive step-up voltage, which is a positive voltage whose magnitude is the sum of the magnitude of the first voltage and the magnitude of the third voltage. The positive step-up circuit 151 may provide the positive step-up voltage to the positive regulator 161.

The negative step-up circuit 152 may receive the first voltage and the third voltage. The negative step-up circuit 152 may generate a negative step-up voltage, which is a negative voltage whose magnitude is the sum of the magnitude of the first voltage and the magnitude of the third voltage. The negative step-up circuit 152 may provide the negative step-up voltage to the negative regulator 162.

The positive regulator 161 may acquire the positive step-up voltage from the positive step-up circuit 151. The positive regulator 161 may regulate the positive step-up voltage to generate a gate high voltage forming the second voltage. The gate high voltage may be a separate voltage having a magnitude different from the first voltage or the third voltage. The positive regulator 161 may output the gate high voltage to the gate driver 120.

The negative regulator 162 may acquire a negative step-up voltage from the negative step-up circuit 152. The negative regulator 162 may regulate the negative step-up voltage to generate a gate low voltage forming the second voltage. The gate low voltage may be a separate voltage having a magnitude different from the first voltage or the third voltage. The negative regulator 162 may output the gate low voltage to the gate driver 120.

If the power supply connected to the gate driver 120 and the source driver 130 is implemented as a single power supply as in existing electronic devices, it is not physically easy to keep the voltage level constant as the number of gate drivers 120 and source drivers 130 and the number of output pins increase. In addition, if the power supply connected to the gate driver 120 and the source driver 130 is implemented as a single power supply, the electro-static protection circuit may only discharge static electricity introduced flowing from the outside of the gate driver 120 and the source driver 130, or static electricity generated between the gate driver 120 and the source driver 130, and may not discharge static electricity introduced into power terminals or internal elements inside the source driver 130.

On the other hand, according to an embodiment of the present disclosure, electric power may be supplied to the gate driver 120 using the first power supply 190 separated from the second power supply 310. In addition, by generating the second voltage independent of the first voltage or the third voltage generated by the first power supply 310, electric power may be supplied to the gate driver 120. Accordingly, it is possible to independently supply electric power to the gate driver 120 and the source driver 130, and therefore, even if the number of gate drivers 120 and source drivers 130 and the number of output pins increase with the increase in resolution, it is possible to stably provide electric power to the gate driver 120 and the source driver 130.

In addition, according to an embodiment of the present disclosure, since the power supplies connected to the gate driver 120 and the source driver 130 is independently formed, it is possible to stably maintain the voltage level of the power input terminal PIN of the amplifier circuit 137 provided in the source driver 130. For example, if the power supplies connected to the gate driver 120 and the source driver 130 are independent of each other, the protection circuit 136 disposed to be adjacent to the source driver 130 may effectively discharge the static electricity introduced into the power input terminal PIN of the amplifier circuit 137.

Figure 11:
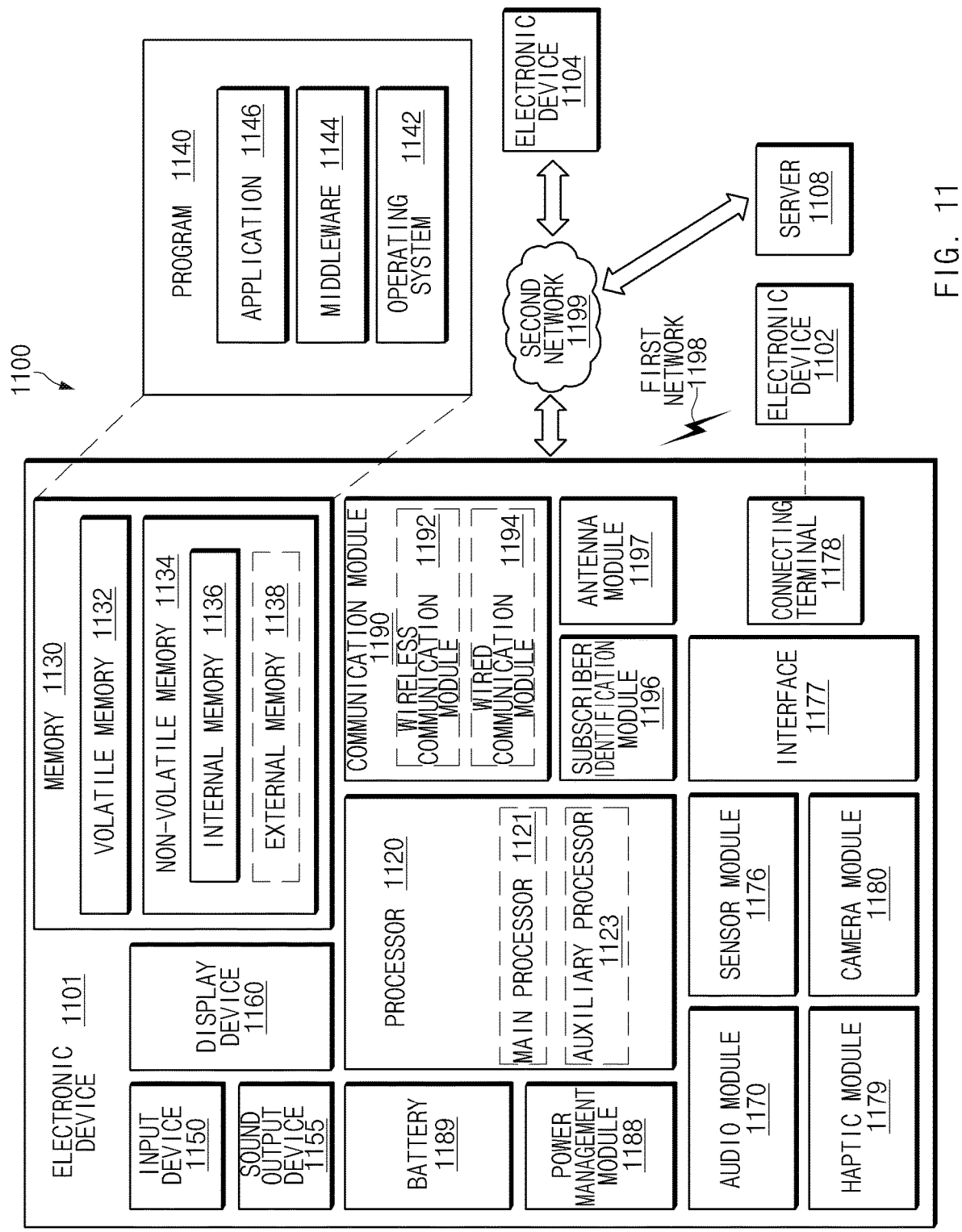
FIG. 11 is a block diagram illustrating an electronic device in a network environment according to various embodiments.

FIG. 11 is a block diagram illustrating an electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input device 1150, a sound output device 1155, a display device 1160, an audio module 1170, a sensor module 1176, an interface 1177, a haptic module 1179, a camera module 1180, a power management module 1188, a battery 1189, a communication module 1190, a subscriber identification module (SIM) 1196, or an antenna module 1197. In some embodiments, at least one (e.g., the display device 1160 or the camera module 1180) of the components may be omitted from the electronic device 1101, or one or more other components may be added in the electronic device 1101. In some embodiments, some of the components may be implemented as single integrated circuitry. For example, the sensor module 1176 (e.g., a fingerprint sensor, an iris sensor, or an illuminance sensor) may be implemented as embedded in the display device 1160 (e.g., a display).

The processor 1120 may execute, for example, software (e.g., a program 1140) to control at least one other component (e.g., a hardware or software component) of the electronic device 1101 coupled with the processor 1120, and may perform various data processing or computation. According to one embodiment, as at least part of the data processing or computation, the processor 1120 may load a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), and an auxiliary processor 1123 (e.g., a graphics processing unit (GPU), an image signal processor (ISP), a sensor hub processor, or a communication processor (CP)) that is operable independently from, or in conjunction with, the main processor 1121. Additionally or alternatively, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display device 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123.

The memory 1130 may store various data used by at least one component (e.g., the processor 1120 or the sensor module 1176) of the electronic device 1101. The various data may include, for example, software (e.g., the program 1140) and input data or output data for a command related thererto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input device 1150 may receive a command or data to be used by other component (e.g., the processor 1120) of the electronic device 1101, from the outside (e.g., a user) of the electronic device 1101. The input device 1150 may include, for example, a microphone, a mouse, or a keyboard.

The sound output device 1155 may output sound signals to the outside of the electronic device 1101. The sound output device 1155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1160 may visually provide information to the outside (e.g., a user) of the electronic device 1101. The display device 1160 may include, for example, a display, a hologram device, or a projector and control circuitry to control a corresponding one of the display, hologram device, and projector. According to an embodiment, the display device 1160 may include touch circuitry adapted to detect a touch, or sensor circuitry (e.g., a pressure sensor) adapted to measure the intensity of force incurred by the touch.

The audio module 1170 may convert a sound into an electrical signal and vice versa. According to an embodiment, the audio module 1170 may obtain the sound via the input device 1150, or output the sound via the sound output device 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector), The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to one embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™ wireless-fidelity (Wi-Fi) direct, or infrared data association (IrDA)) or the second network 1199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The antenna module 1197 may transmit or receive a signal or power to or from the outside (e.g., the external electronic device) of the electronic device 1101. According to an embodiment, the antenna module 1197 may include one or more antennas, and, therefrom, at least one antenna appropriate for a communication scheme used in the communication network, such as the first network 1198 or the second network 1199, may be selected, for example, by the communication module 1190 (e.g., the wireless communication module 1192). The signal or the power may then be transmitted or received between the communication module 1190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 and 1104 may be a device of a same type as, or a different type, from the electronic device 1101. According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, or client-server computing technology may be used, for example.

Figure 12:
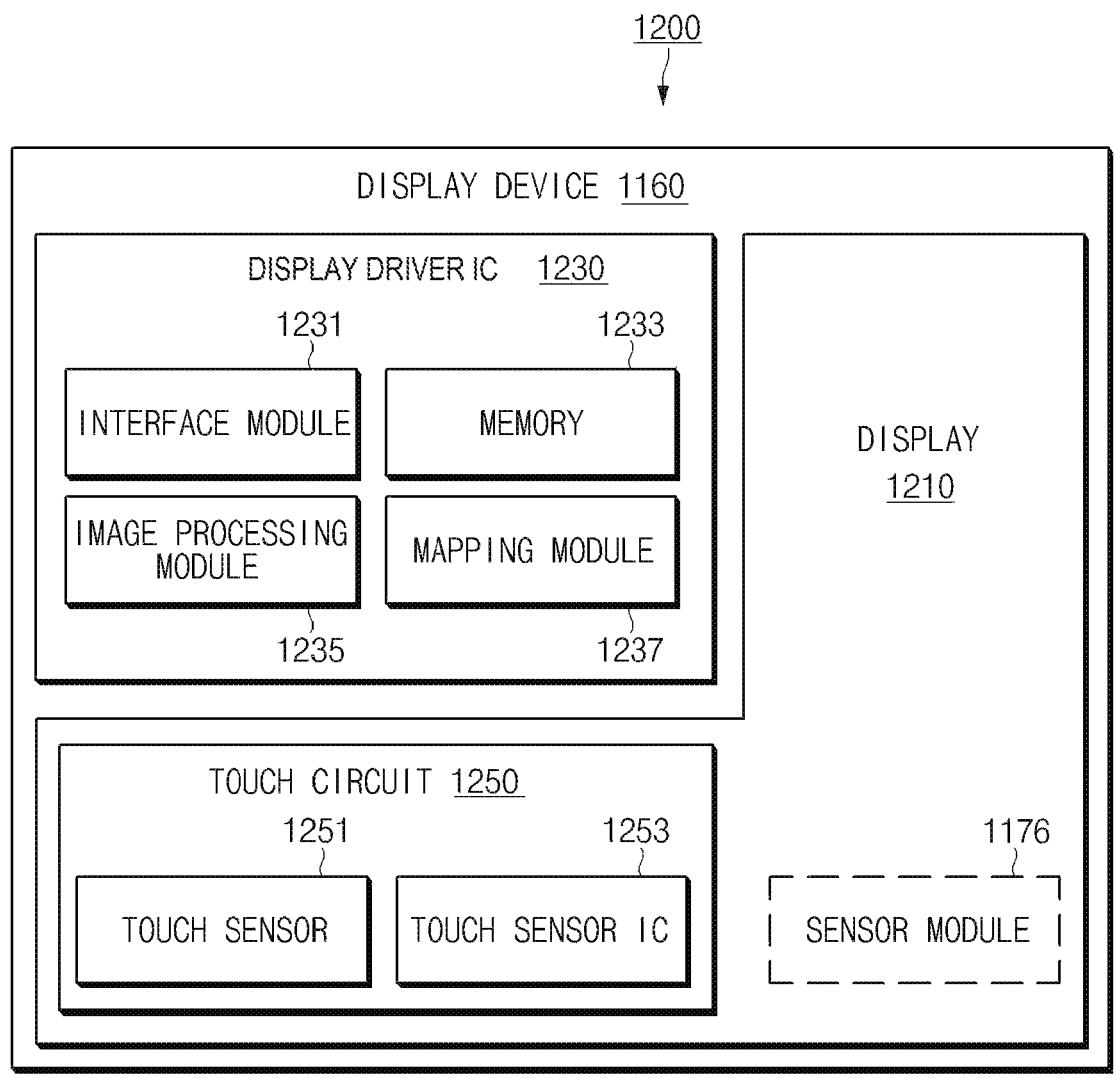
FIG. 12 is a block diagram illustrating the display device according to various embodiments.

FIG. 12 is a block diagram 1200 illustrating the display device 1160 according to various embodiments. Referring to FIG. 12, the display device 1160 may include a display 1210 and a display driver integrated circuit (DDI) 1230 to control the display 1210. The DDI 1230 may include an interface module 1231, memory 1233 (e.g., buffer memory), an image processing module 1235, or a mapping module 1237. The DDI 1230 may receive image information that contains image data or an image control signal corresponding to a command to control the image data from another component of the electronic device 1101 via the interface module 1231.

For example, according to an embodiment, the image information may be received from the processor 1120 (e.g., the main processor 1121 (e.g., an application processor)) or the auxiliary processor 1123 (e.g., a graphics processing unit) operated independently from the function of the main processor 1121. The DDI 1230 may communicate, for example, with touch circuitry 1150 or the sensor module 1176 via the interface module 1231. The DDI 1230 may also store at least part of the received image information in the memory 1233, for example, on a frame by frame basis.

The image processing module 1235 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 1210.

The mapping module 1237 may generate a voltage value or a current value corresponding to the image data pre-processed or post-processed by the image processing module 1235. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 1210 may be driven, for example, based at least in part on the voltage value or the current value such that visual information (e.g., a text, an image, or an icon) corresponding to the image data may be displayed via the display 1210.

According to an embodiment, the display device 1160 may further include the touch circuitry 1250. The touch circuitry 1250 may include a touch sensor 1251 and a touch sensor IC 1253 to control the touch sensor 1251. The touch sensor IC 1253 may control the touch sensor 1251 to sense a touch input or a hovering input with respect to a certain position on the display 1210. To achieve this, for example, the touch sensor 1251 may detect (e.g., measure) a change in a signal (e.g., a voltage, a quantity of light, a resistance, or a quantity of one or more electric charges) corresponding to the certain position on the display 1210. The touch circuitry 1250 may provide input information (e.g., a position, an area, a pressure, or a time) indicative of the touch input or the hovering input detected via the touch sensor 1251 to the processor 1120. According to an embodiment, at least part (e.g., the touch sensor IC 1253) of the touch circuitry 1250 may be formed as part of the display 1210 or the DDI 1230, or as part of another component (e.g., the auxiliary processor 1123) disposed outside the display device 1160.

According to an embodiment, the display device 1160 may further include at least one sensor (e.g., a fingerprint sensor, an iris sensor, a pressure sensor, or an illuminance sensor) of the sensor module 1176 or a control circuit for the at least one sensor. In such a case, the at least one sensor or the control circuit for the at least one sensor may be embedded in one portion of a component (e.g., the display 1210, the DDI 1230, or the touch circuitry 1150)) of the display device 1160. For example, when the sensor module 1176 embedded in the display device 1160 includes a biometric sensor (e.g., a fingerprint sensor), the biometric sensor may obtain biometric information (e.g., a fingerprint image) corresponding to a touch input received via a portion of the display 1210. As another example, when the sensor module 1176 embedded in the display device 1160 includes a pressure sensor, the pressure sensor may obtain pressure information corresponding to a touch input received via a partial or whole area of the display 1210. According to an embodiment, the touch sensor 1251 or the sensor module 1176 may be disposed between pixels in a pixel layer of the display 1210, or over or under the pixel layer.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a display panel including one or more pixels;
   one or more gate drivers receiving electric power from a first power supply; and
   a display driver integrated circuit configured to drive the display panel,
   wherein any one of the one or more gate drivers is connected to a first pixel of the one or more pixels,
   wherein the display driver integrated circuit includes:
      one or more source drivers including a first source driver; and
      at least one protection circuit connected to the first source driver,
   wherein the first source driver includes one or more amplifier circuits receiving electric power from a second power supply different from the first power supply and connected to the first pixel,
   wherein the at least one protection circuit is connected to a power input terminal of the one or more amplifier circuits,
   wherein at least a portion of the at least one protection circuit is branched between the second power supply and the power input terminal to be connected to a ground of the display driver integrated circuit, and
   wherein the at least one protection circuit includes:
      a capacitor having a first terminal connected to the second power supply and the one or more amplifier circuits;
      a resistor disposed between a second terminal of the capacitor and the ground; and
      a switching element including a gate terminal connected to the second terminal of the capacitor, a drain terminal connected to the first terminal of the capacitor, and a source terminal connected to the ground.

2. The electronic device of claim 1, wherein the switching element senses at least a temporary change in voltage of the power input terminal at the gate terminal through the capacitor, and at least temporarily electrically connects the drain terminal and the source terminal.

3. The electronic device of claim 1, wherein the switching element discharges, to the ground, static electricity introduced into the power input terminal, by using a change in voltage that the static electricity induces at least temporarily at the gate terminal through the capacitor.

4. The electronic device of claim 1, wherein the at least one protection circuit is disposed to be adjacent to at least one side edge of the first source driver outside the first source driver and is simultaneously connected to the power input terminal of the one or more amplifier circuits.

5. The electronic device of claim 1, wherein the at least one protection circuit is disposed on at least one side of an inner area of the first source driver and is simultaneously connected to the power input terminal of the one or more amplifier circuits.

6. The electronic device of claim 1,
   wherein the display driver integrated circuit further includes a gamma block connected to the first source driver, and
   wherein the first source driver further includes one or more decoders connected to the one or more amplifier circuits and the gamma block.

7. The electronic device of claim 1,
   wherein the first pixel includes a plurality of sub-pixels,
   wherein at least one of the plurality of sub-pixels is connected to an output terminal of the one or more amplifier circuits, and
   wherein the plurality of sub-pixels includes:
      a red sub-pixel;
      a green sub-pixel adjacent to the red sub-pixel in a longitudinal direction of a first edge; and
      a blue sub-pixel adjacent to the green sub-pixel in the longitudinal direction of the first edge.

8. The electronic device of claim 1,
   wherein the first pixel includes a plurality of sub-pixels,
   wherein at least one of the plurality of sub-pixels is connected to an output terminal of the one or more amplifier circuits, and
   wherein the plurality of sub-pixels includes:
      a red sub-pixel;
      a first green sub-pixel adjacent to the red sub-pixel in a longitudinal direction of a first edge;
      a blue sub-pixel adjacent to the red sub-pixel in a longitudinal direction of a second edge; and
      a second green sub-pixel adjacent to the blue sub-pixel in the longitudinal direction of the first edge.

9. The electronic device of claim 1, wherein the switching element is configured to:
   when a difference value between a voltage of a gate electrode and a voltage of a source electrode is smaller than a threshold voltage of the switching element, be turned off to block current from flowing from a drain electrode to the source electrode, and
   when the difference value between the voltage of the gate electrode and the voltage of the source electrode is greater than the threshold voltage of the switching element, be turned on to allow current to flow from the drain electrode to the source electrode.

10. A display driver integrated circuit comprising:
one or more source drivers;
a gamma block connected to a first source driver of the one or more source drivers; and
at least one protection circuit connected to the first source driver,
wherein the first source driver includes:
  one or more amplifier circuits receiving electric power from a second power supply different from a first power supply supplying electric power to one or more gate drivers, and outputting a data voltage; and
  one or more decoders connected to the one or more amplifier circuits,
wherein the at least one protection circuit is connected to a power input terminal of the one or more amplifier circuits,
wherein at least a portion of the at least one protection circuit is branched between the second power supply and the power input terminal to be connected to a ground of the display driver integrated circuit, and
wherein the at least one protection circuit includes:
  a filter element having a first terminal connected to the second power supply and the one or more amplifier circuits;
  a resistor disposed between a second terminal of the filter element and the ground; and
  a switching element including a control terminal connected to a second terminal of the filter element, a first terminal connected to the first terminal of the filter element, and a second terminal connected to the ground.

11. The display driver integrated circuit of claim 10, wherein the filter element is a capacitor,
wherein the switching element is a metal oxide semiconductor field effect transistor (MOSFET), and
wherein the control terminal is a gate terminal.

12. The display driver integrated circuit of claim 10, wherein the first power supply receives a first voltage from the second power supply to generate and output a second voltage different from the first voltage through a voltage step-up and a voltage regulation.

13. The display driver integrated circuit of claim 10, wherein the switching element is configured to:
  when a difference value between a voltage of the control terminal and a voltage of the second terminal is smaller than a threshold voltage of the switching element, be turned off to block current from flowing from the first terminal to the second terminal, and
  when the difference value between the voltage of the control terminal and the voltage of the second terminal is greater than the threshold voltage of the switching element, be turned on to allow current to flow from the first terminal to the second terminal.

14. The display driver integrated circuit of claim 11, wherein the switching element discharges, to the ground, static electricity introduced into the power input terminal, by at least temporarily electrically connecting a drain terminal and a source terminal by using a change in voltage that the static electricity induces at least temporarily induced at the gate terminal through the capacitor.

* * * * *